(12) United States Patent
Demaretz (10) Patent No.: US 10,127,418 B2
(45) Date of Patent: Nov. 13, 2018

(54) CONTAINER WITH A DETECTION SYSTEM

(71) Applicant: STANLEY MIDDLE EAST FZE, Dubai (AE)

(72) Inventor: Thierry Demaretz, Grandpuits (FR)

(73) Assignee: Stanley Middle East FZE, Dubai (AE)

( * ) Notice: Subject to any disclaimer, the term of this patent is extended or adjusted under 35 U.S.C. 154(b) by 0 days.

(21) Appl. No.: 15/626,933

(22) Filed: Jun. 19, 2017

(65) Prior Publication Data

US 2018/0060621 A1 Mar. 1, 2018

Related U.S. Application Data

(63) Continuation of application No. PCT/IB2015/059789, filed on Dec. 18, 2015.

(30) Foreign Application Priority Data

Dec. 19, 2014 (EP) .................. 20140199428

(51) Int. Cl.
| | |
|---|---|
| *G06K 7/10* | (2006.01) |
| *B25H 3/02* | (2006.01) |
| *H01Q 1/52* | (2006.01) |
| *B65D 43/16* | (2006.01) |
| *G06K 19/077* | (2006.01) |
| *H05K 9/00* | (2006.01) |
| *G07G 1/00* | (2006.01) |

(52) U.S. Cl.
CPC .......... *G06K 7/10366* (2013.01); *B25H 3/02* (2013.01); *B65D 43/16* (2013.01); *G06K 7/10425* (2013.01); *G06K 19/07758* (2013.01); *G07G 1/009* (2013.01); *H01Q 1/526* (2013.01); *H05K 9/0043* (2013.01)

(58) Field of Classification Search
CPC ...... G06K 7/0008; G07F 7/02; G07G 1/0081; G07G 1/009
See application file for complete search history.

(56) References Cited

U.S. PATENT DOCUMENTS

| | | | | |
|---|---|---|---|---|
| 7,225,980 B2* | 6/2007 | Ku | ........................ | G06K 7/0008 235/383 |
| 8,020,768 B2* | 9/2011 | Ramos-Elizondo | ........................ | G06Q 10/087 235/375 |
| 9,836,907 B2* | 12/2017 | Phillips | .............. | G07C 9/00912 |

(Continued)

*Primary Examiner* — Seung Lee
(74) *Attorney, Agent, or Firm* — Caeden Drayton; Adan Ayala (57) ABSTRACT

A portable container (2) for one or more articles (16) each tagged with a respective Radio Frequency Identification (RFID) device (18). The container (2) comprises: a bay (6) having at least one opening (O) for removal and/or placement of RFID-tagged articles (16) into the bay (6); a lid (15) for covering the at least one opening in the bay (6), wherein the lid (15) is openable to permit access to the bay (6); a detector device (21,22) for detecting RFID-tagged articles (16) located in the bay (6); a power supply (30) for supplying electrical power to the detector device (21,22). The container (2) further comprises: an electromagnetic shield (19,19a,19b,19c,19d) wherein the bay (6) and the at least one opening in the bay (6) is enclosed by the electromagnetic shield and wherein the lid (15) forms part of the electromagnetic shield.

19 Claims, 5 Drawing Sheets

(56) References Cited

U.S. PATENT DOCUMENTS

2009/0072029 A1* 3/2009 Martin ............... G06Q 10/087
  235/385
2016/0117899 A1* 4/2016 Chevalier ............... B25H 3/02
  340/572.1

* cited by examiner

CONTAINER WITH A DETECTION SYSTEM

This patent application claims priority to PCT/IB/2015/059789, filed Dec. 18, 2015 and EP20140199428, filed Dec. 19, 2014 which is hereby incorporated by reference in its entirety.

FIELD OF INVENTION

The present invention relates to a portable container with a detector device for detecting removal and/or placement of articles in the container.

BACKGROUND

Although the following description refers to a tool bag it will be appreciated by the person skilled in the art that the apparatus for detecting the presence of articles in a container can be used in any portable container, for example, tool cabinets, tool cupboards, tool boxes, backpacks, and the like, and it is not limited to tool bags.

The use of tool bags to contain tools and accessories for tools is well known. When a user is performing a job on site tools and other articles are routinely removed from a tool bag to perform the job but they may not be replaced in the tool bag after the job is finished. The tools and other articles may remain at the job site and/or become lost. This is a problem because many tools are expensive to replace. It is also problem in industrial environments where mislaid tools or other articles risk causing damage to machinery. Many industrial environments, for example, aerospace, railway, shipbuilding, nuclear, automobile, or petrochemical sectors, are particularly sensitive to what is referred to as 'foreign object damage' (FOD) to their machinery. Naturally, these sectors are particularly interested in foreign object exclusion solutions.

German utility model No. DE 202 07 572 U1 discloses a tool box carried by craftspeople to jobs outside their own workshop. The tools do not have a space permanently allocated to them in the tool box. Instead, the tools lie loosely in disorder in the tool box. Whilst this may be an efficient use of space within the tool box, it is not easy to visually inspect which tools are in the tool box. So, each tool comprises a smart label like that known in the retail industry. The tool box comprises an interrogation device. Upon activation, the interrogation device determines the completeness or incompleteness of the tools in the tool box. The interrogation device may be programmed to determine which tools are missing and indicate them on a display.

A smart label may be a Radio Frequency Identification (RFID) device. An RFID device is any electronic identification device, such as a transponder, that may be attached to an article to identify and track its signature via the medium of a radio-frequency signal. In practice, a RFID device is attached to an article, and a RFID reader like the interrogation device of DE 202 07 572 U1 senses the presence and identifying information associated with the RFID device. The RFID device may be active, semi-active, or passive and may or may not include storage memory. The RFID device contains information like, for example, the type and serial number of the article to which it is attached.

United Kingdom patent publication No. GB 2 451 957 A discloses a tool box equipped with a handle, a detection means, an activation button, an alarm and an LCD display screen. In use, the tool box contains a number of tools each tagged with a respective RFID device which the tool box is intended to transport from site to site. The RFID devices are registered to their corresponding tools on an external computer and the registration data is downloaded to the tool box. The detection means is configured to detect if any tools are missing from the tool box using the registration data. When a user arrives at site, the activation button is pressed, the detection means scans the contents of the tool box and records the RFID-tagged tools into a first inventory stored in a memory of the detection means. Once the job is complete, the user gathers the RFID-tagged tools and replaces them in the tool box. The activation button is pressed again, the detection means scans the contents of the tool box and compiles a second inventory for comparison with the first inventory. If the detection means identifies that any RFID-tagged tools are missing that were present the first time the activation button was pressed, the alarm sounds to alert the user. The identity of the missing tool and its RFID device number are displayed to the user on the LCD screen. GB 2 451 957 A discloses a variant tool box where the detection means continually scans the presence of RFID-tagged tools in the tool box. The variant detection means alerts the user if any RFID-tagged tools are missing when the tool box lid is closed.

The maintenance sector, particularly the aero-engine maintenance sector, is especially sensitive to what it also calls FOD caused by stray tools and other parts contaminating machinery which can lead to machinery damage and ultimately failure. Devices for identification and recovery of RFID-tagged tools and parts contribute to minimizing FOD. The detection means of the tool box of GB 2 451 957 A may potentially detect the RFID-tagged tools when they are close to, but not in, the tool box. This may leads to false detections which make the user think that RFID-tagged tools are in the tool box when in fact they are not. The user may depart from the work site, leave stray RFID-tagged tools behind and not realise that they are missing. This may be especially problematic for smaller tools which may not be easily seen by the user or which may be obscured by features of the work site.

SUMMARY OF THE INVENTION

It is an aim of the present invention to overcome or at least mitigate the aforementioned problems. In a first aspect of the invention there is provided a portable container for one or more articles each tagged with a respective Radio Frequency Identification (RFID) device, wherein the container comprises: a bay having at least one opening for removal and/or placement of RFID-tagged articles in the bay; a lid for covering the at least one opening in the bay, wherein the lid is openable to permit access to the bay; a detector device for detecting RFID-tagged articles located in the bay; and a power supply for supplying electrical power to the detector device; wherein the container comprises: an electromagnetic shield wherein the bay and the at least one opening in the bay is enclosed by the electromagnetic shield and wherein the lid forms part of the electromagnetic shield.

The shield helps to avoid false detection of RFID-tagged articles inside the container that could cause the user into thinking that all the RFID-tagged articles are inside the container when, in fact, some may be outside the container nearby. This feature of the container reassures the user that all the RFID-tagged tools are present in the bay if that is indicated by the detector device. This may improve the user's working efficiency. A visual check for stray RFID-tagged articles may not be necessary for a user concerned about FOD. The user may depart from the work with the knowledge that stray RFID-tagged articles have not been left behind.

Preferably, the lid is electrically connectable to the shield around the at least one opening in the bay. This improves continuity of the shield around the at least one opening which helps suppression of leaks of radio frequency signals.

Preferably, the portable container comprises a sensor for sensing electrical connection of the lid around the at least one opening in the bay, wherein the sensor is configured to transmit a lid closed signal to the detector device when the lid is electrically connected around the at least one opening in the bay. The sensor may arm the detector to determine an appropriate occasion (i.e. when the lid is closed) to reliably detect RFID-tagged articles located in the bay. Conversely, absence of a lid closed signal from the sensor may disarm the detector device to determine when it is inappropriate (i.e. when the lid is open) to reliably detect RFID-tagged articles located in the bay.

Preferably, the lid is magnetically connectable to the shield. This may provide a simple and reliable means to mechanically connect the lid to the rest of the shield whist, at the same time, providing an electrical connection of the lid around the at least one opening of the bay.

Preferably, the lid is hingedly coupled to the portable container. This may help to avoid misplacement or loss of the lid.

Preferably, the shield comprises flexible electromagnetic shielded material. This permits the use of flexible materials in the construction of the container, particularly the walls of the container, to reduce weight and avoid damage to the working environment.

To detect RFID-tagged articles located inside the bay and communicate with the user, the detector device needs to transmit information via connections across the shield. Preferably, the portable container comprises an electromagnetic interference filter coupled to the or each connection across the shield. The electromagnetic interference filter suppresses interference, like, for example, unwanted radio frequency signals from outside the shield, from passing into the tool bay. Only communication between the various components of the detector device may pass through connections across the shield. Thus, the electromagnetic interference filter ensures that any such connections do not act as a conduit for external radio frequency signals which could, if allowed to pass, fool the detector device into detecting the presence of RFID-tagged articles tool inside the shield when in fact they are not.

In a busy working environment, users of the tool box of GB 2 451 957 A may not have time, or may forget, to activate the detection means on a regular basis. A missing RFID-tagged tool may not be noticed until a long time after it has been lost. Even if the missing article is identified by the detection means this is of little use if the missing tool cannot be physically found because the user cannot recall when and where it was last used. Thus, inattention to regular activation of the detection means may result in time being wasted while the user searches for a missing tool. The missing tool may not eventually be found. On the other hand, continual cyclical activation of the detection means either requires more electrical power and frequent recharging of a portable electrical power source or it requires connection to an external power source. Either option would inhibit mobility.

Preferably, the tool container comprises an activation means in communication with the detector device, wherein the activation means is operable to cause the detector device to detect a reference list of RFID-tagged articles located in the bay; a verification means in communication with the detector device, wherein the verification means is operable by movement of the container to cause the detector device to detect RFID-tagged articles located in the bay and to signal deviation from the reference list; and a signal means in communication with the detector device for transmitting signals from the detector device to a user.

The activation means enables a user to record a reference list of RFID-tagged articles initially selected to perform a job. The user transports the container to the work site and begins the job. At the end of the job, or working day, the user returns to the source of the RFID-tagged articles, typically a storeroom. The involves moving the container which, when the lid is closed, automatically operates the verification means and causes the detector device to detect and compare the RFID-tagged articles actually in the container with the reference list. If there are too many, or too few, articles then the user has taken someone else's property or forgotten their own articles. The user is automatically alerted by the signal means to any deviation between what actually is, and what should be, in the container before the user has left the work site. The signal means may transmit any signal that attracts the attention of the user, for example, an information display signal, an optical signal, an audible signal or tactile signal such as vibration. The signal may vary according to the type information to be transmitted. Advantageously, the user is alerted promptly by the signal means thus making it easier to search for missing articles or return someone else's articles before the situation evolves and in case the user's memory fades. Inattention on the part of the user cannot neglect to operate the detector device; this occurs automatically when the lid is closed and the container is moved. The detector device is operated by the verification means when the container moves and not continuously. This economises on electrical power consumption by the detector device.

Preferably, the detector device is configured to signal an article absent signal upon detection of absence of a RFID-tagged article on the reference list and the detector device is configured to signal an unknown article signal upon detection of a RFID-tagged article not on the reference list. Thus, the user can tell whether there are too many, or too few, articles in the container and react accordingly.

The detector device may be lockable against detection of the reference list. Locking of the detector device prevents accidental modification to the reference list after it has been recorded by the user. Thus, the user can be sure that any deviation signal relates to deviation from the original reference list. A key is needed to enable modification to the reference list. This may be required, for example, at the end of the working day when the user may wish to empty the container of RFID-tagged tools and reset the reference list to zero in preparation for another working day.

Preferably, the detector device is configured to signal an initialisation signal upon interaction with a key configured to permit detection of the reference list. The initialisation signal confirms that the reference list has been established in the presence of the key. The user may obtain the key to unlock the detector device from a storeroom, for example.

The verification means may comprise an accelerometer. An accelerometer experiences acceleration associated with movement of weight. This is a simple means of detecting movement of the container which does not rely on interaction with objects outside the container.

The signal means may comprise at least one LED. LEDs are reliable means of providing an optical signal to a user. Advantageously, LEDs are more efficient than, for example, conventional filament lamps. This may help to economise electrical power consumption by the detector device.

Preferably, each LED is a multicoloured LED. This enables the detector device to provide different colour optical signals according to the nature of the signal transmitted. This may help to clarify the meaning of the various signals when they are transmitted optically to the user.

The signal means may comprise a display configured to display the number and/or identify of RFID-tagged articles detected by the detector device in the bay. A display can provide detailed information on the RFID-tagged articles.

Preferably, the display is configured to display the article absent signal, wherein the article absent signal comprises number and/or identify of absent RFID-tagged articles. Thus, the user knows which particular RFID-tagged article is missing outside the container and the user need not search amongst the articles inside the container. This may save time, especially if the missing article is visible to the user.

The detector device may comprise a reader device comprising an antenna reader and at least four antennas in communication with the antenna reader, wherein each antenna is configured to detect only RFID-tagged articles in the bay.

The detector device may comprise a data processing device having a central processing unit and a memory for recording at least the reference list.

The container may comprise one of a tool cabinet, a tool cupboard, a tool box, or a tool bag. The container may comprise one or more support wheels. This may help transport heavy loads over greater distance. The container of the invention may be any one of those commonly used in the industrial or workshop environment. The container may be for storage of one or more RFID-tagged tools. Tools can be expensive and it is beneficial to provide a device for tracking and retaining tools lest they become lost or misplaced inside machinery where they can cause inestimable damage.

BRIEF DESCRIPTION OF THE DRAWINGS

Embodiments and advantages of the invention will be understood by reference to the following description which is given by way of example and in association with the accompanying drawings of which.

DETAILED DESCRIPTION

Figure 1:
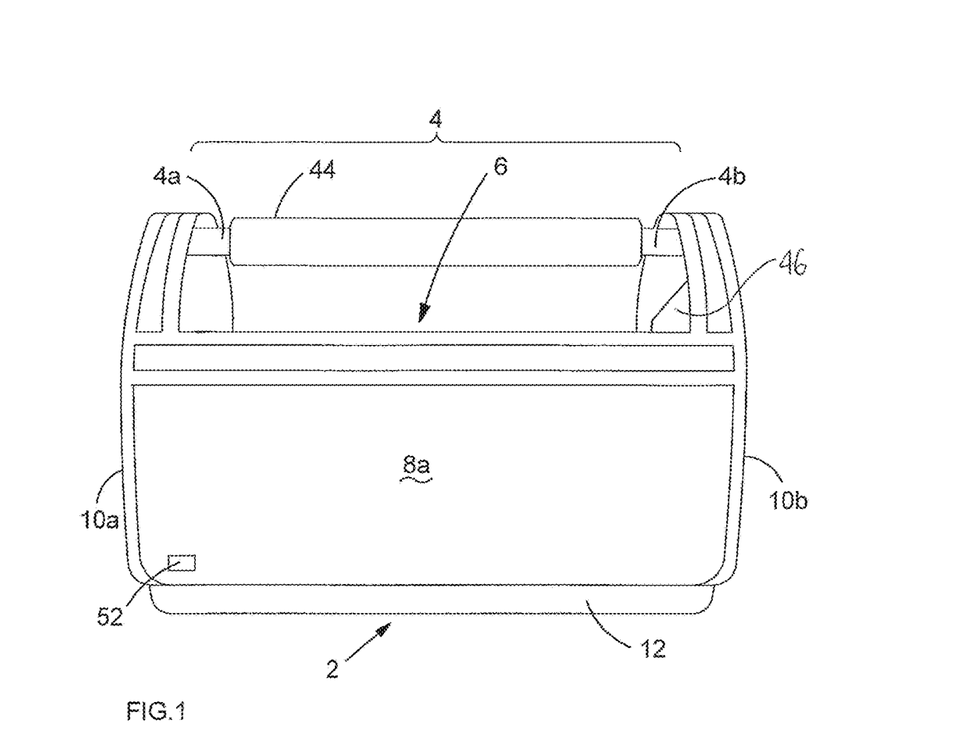
FIG. 1 shows a side elevation view of a container in accordance with an embodiment of the invention.
Figure 2:
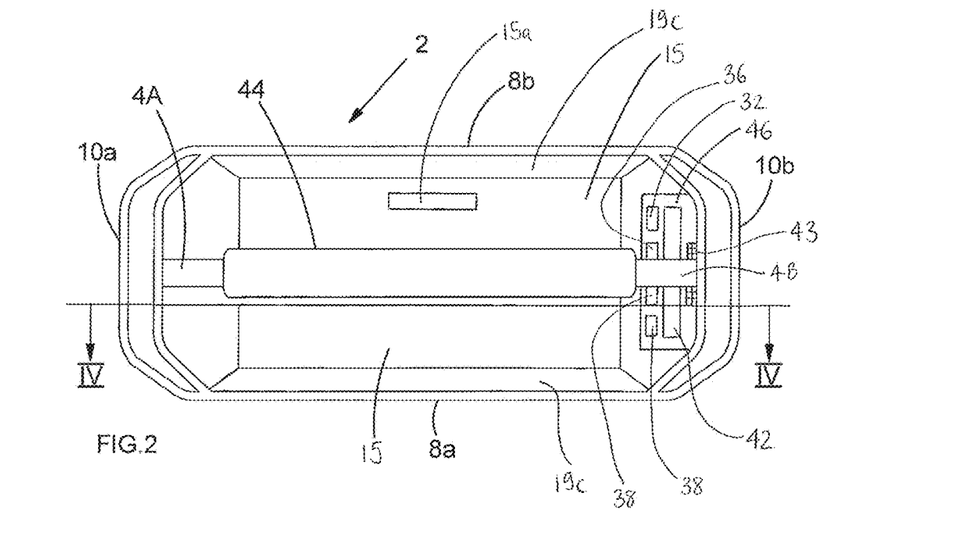
FIG. 2 shows a top view of the container of FIG. 1.

Referring to FIGS. 1 and 2, there is shown a container in the form of a tool bag 2. The tool bag 2 comprises a handle 4 and a tool bay 6. The handle 4 is connected to a rigid frame which forms the general shape, or skeleton, of the tool bag 2. The tool bay 6 comprises a pair of opposing side walls 8a, 8b, a pair of opposing end walls 10a, 10b and a base 12. The side walls 8a, 8b and end walls 10a, 10b are made of a flexible durable material which is clad about the frame of the tool bag 2. The base 12 is made of a rigid material and is fixed to the bottom of the frame. The base 12 comprises an internal cavity 14 the use of which is explained in more detail below. The tool bag 2 comprises a generally rectangular lid 15 over the entrance to the tool bay 6 on the opposite side to the base 12. The lid 15 is made of the same material as the side walls 8a, 8b and end walls 10a, 10b. The lid 15 is openable to provide access to the tool bay 6 as is explained in more detail below. The lid 15 comprises a lid handle 15a for this purpose.

Figure 3:
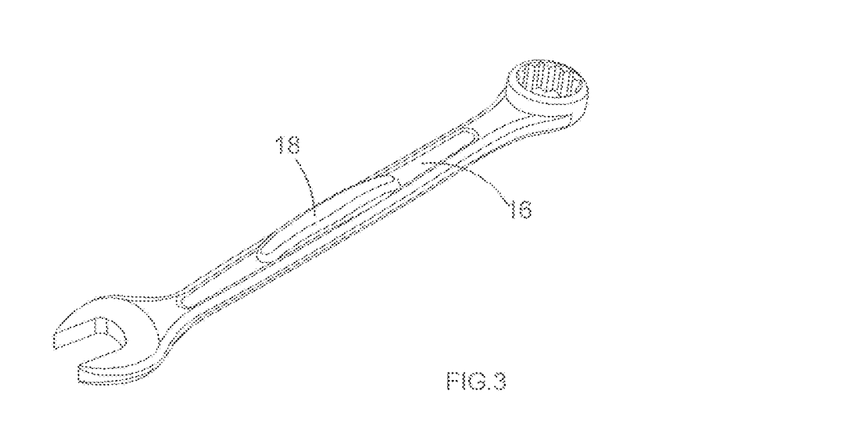
FIG. 3 shows a tool for placement in the container of FIG. 1.

The tool bag 2 is intended to be used as a container for transporting tools 16 each of which is tagged with its own RFID device 18 programmed with a unique identification signature. The RFID-tagged tools 16 may be loosely arranged in the tool bay 6 in no particular order such that may be difficult to know by visual inspection exactly which tools 16 are in the tool bay 6 at any one time. An example RFID-tagged tool 16 is shown in FIG. 3.

When the lid 15 is closed, the tool bay 6 is entirely enclosed by an electromagnetic shield 19 implanted into the tool bag 2. The shield 19 may comprise any shielded fabric (i.e. metal fibres laminated with plastics material or the like), metal fibre mesh, metal plate and/or substrate coated with conductive paint or lacquer capable of blocking external radio frequency signals. The shield 19 comprises shield walls 19a, a shield base 19b, a shield roof 19b and the lid 15 which collectively form an openable shielded enclosure in which the RFID-tagged tools 16 may be stored. The shield 19 behaves like a Faraday cage.

The shield walls 19a and shield base 19b follow the inner profile of the side walls 8a, 8b, the end walls 10a, 10b and the base 12. The shield roof 19c is located at the top of the tool bay 2 directly below the handle 4. The shield roof 19c is made of sheet metal with a generally rectangular central opening O covered by the lid 15 when the tool bay 6 is closed. The shield roof 19c is electrically coupled to the shield walls 19a and the shield base 19b. The central opening O need not be rectangular and it can instead be any shape which allows passage of the RFID-tagged tools 16 in and out of the tool bay 6.

The lid 15 is hingedly coupled to the shield roof 19c along one long edge 15b adjacent to the shield roof's central opening O. The long edge 15b is on the opposite side of the lid 15 to the lid handle 15a. The other three edges 15c, 15d, 15e of the lid 15 are equipped with strips of magnetic material 19d facing towards the shield roof 19c around the other three sides of the central opening O of the shield roof 19c.

As would be understood by the skilled addressee, the lid 15 may be made of any material that allows openable access inside the tool bay 6. In the present example, the lid 15 comprises flexible shielded material which is electrically coupled to the shield roof 19c along the hinge along of its long edge 15b. The benefit of having a supple lid 15 is that it does not necessarily increase the overall working volume of the tool bag 2 when it is open. A supple lid 15 can be rolled. Flexible magnet material 19d is preferable when the lid 15 is made of flexible material because it preserves practical benefits of having a supple lid.

The magnetic material 19d is magnetically attracted to the shield roof 19c and keeps the lid 15 closed over the shield roof's central opening O unless, or until, a user pulls the lid 15 away from the shield roof 19c to open the tool bay 6. When the magnetic material 19d is in contact with the shield roof 19c, and the lid 15 is closed, the magnetisation ensures electrical continuity between the shielded material of the lid 15 and the shield roof 19c around the perimeter of the central opening O to complete the shield 19. The shield 19 comprises a sensor 19e which detects when the magnetic material 19d is in contact with the shield roof 19c and the lid 15 is closed. Likewise, the sensor 19e detects when the magnetic material 19d is not in contact with the shield roof 19c and the lid 15 is open. As would be understood by the skilled addressee, the sensor 19e may be any sensor capable of detecting the presence of the magnetic material 19d in contact with the shield roof 19c.

Referring to FIGS. 4 to 7, the tool bag 2 is equipped with an electrical circuit 20 for detecting and identifying the number of RFID-tagged tools 16 located in the tool bay 6, detecting if any known RFID-tagged tools 16 are missing from the tool bag 2 once a job is complete, detecting if any unknown RFID-tagged tools 16 are in the tool bag 16 once a job is complete, and alerting the user if there is a discrepancy in the number of RFID-tagged tools 16. The electrical circuit 20 performs these tasks autonomously and without being networked.

Figure 5:
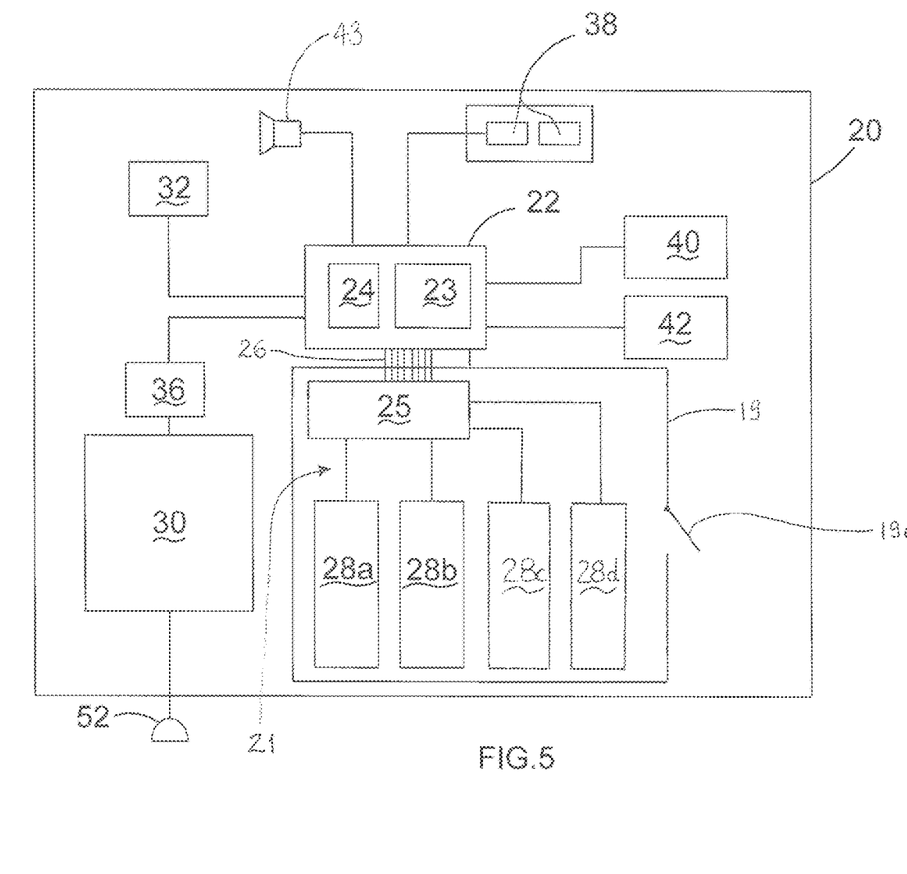
FIG. 5 shows a block diagram of an electrical circuit of the container of FIG. 1.
Figure 6:
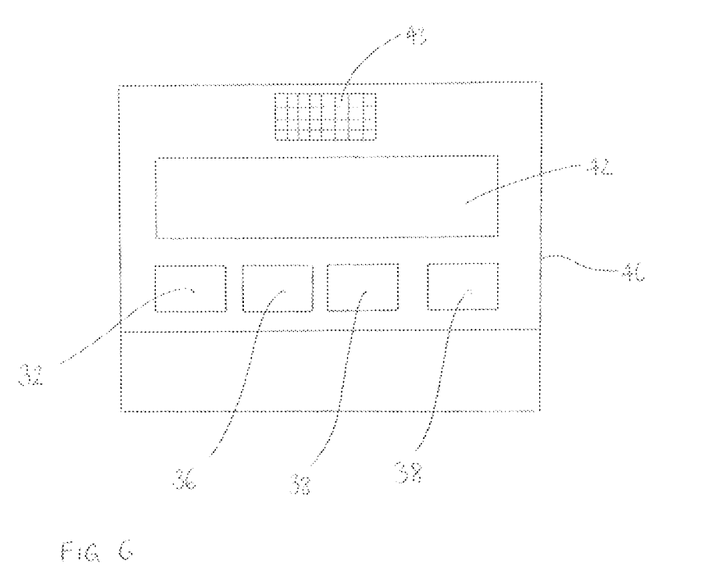
FIG. 6 shows a detailed view of the information display of the container of FIG. 1.
Figure 7:
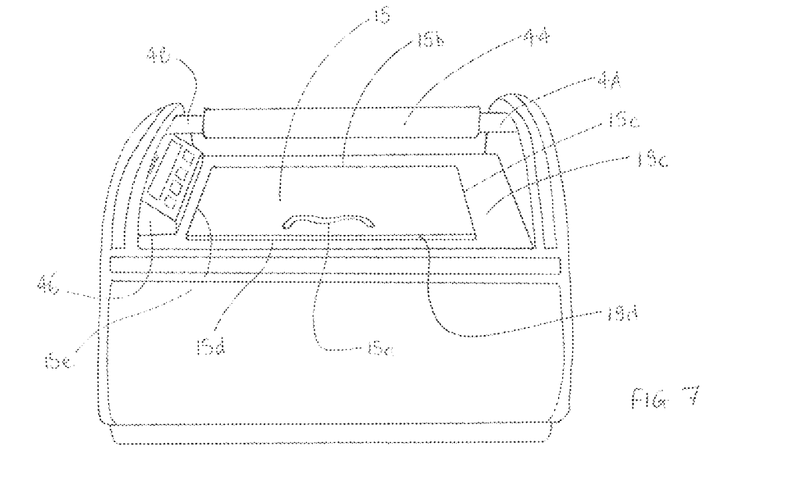
FIG. 7 shows a perspective view of the container of FIG. 1.

The electrical circuit 20 has a detector device comprising a reader device 21 and a data processing device 22. The reader device 21 has an antenna reader 25 and four internal antennas 28a, 28b, 28c, 28d directly coupled to the antenna reader 25. The data processing device 22 has a central processing unit (CPU) 23 and a memory 24. The data processing device 22 is housed within the cavity 14 of the base 12. The data processing device 22 is in communication with the transponder reader device 21 via a serial link 26.

Referring in particular to FIG. 5, the shield 19 and/or its sensor 19e are directly coupled to the data processing device 22. The sensor 19e detects the position of the lid 15 with respect to the shield roof 19c and communicates this information to the data processing device 22.

The antenna reader 25 and the four internal antennas 28a, 28b, 28c, 28d are housed within the shield 19 in a way that protects them from any RFID-tagged tools 16 contained within the tool bay 6. Alternatively, the four internal antennas 28a, 28b, 28c, 28d may be housed within the shield 19 with the antenna reader 25 located outside the shield 19 but that is not the case with the present example.

Only the serial link 26 passes through the shield 19 when the lid 15 is closed. The serial link 26 comprises an electromagnetic interference filter (not shown). The electromagnetic interference filter may be any passive device used to suppress conducted interference that may be found on a signal or power line like the serial link 26. The electromagnetic interference filter suppresses interference created by other equipment with the desired effect being that unwanted radio frequency signals from outside the shield 19 are suppressed from passing into the tool bay 6 via the serial link 26. Only communication between the antenna reader 25 and the data processing device 22 passes via the serial link 26. Thus, the electromagnetic interference filter ensures that the serial link 26 does not act as a conduit for external radio frequency signals which could, if allowed to pass, fool the internal antennas 28a, 28b, 28c, 28d into detecting the presence of RFID devices inside the shield 19 when in fact they are not.

The electrical circuit 20 comprises the shield 19, a battery pack 30 and an initialisation button 32. The battery pack 30 is coupled to the data processing device 22 via an on/off button 36. The initialisation button 32 is directly coupled to the data processing device 22.

Figure 4:
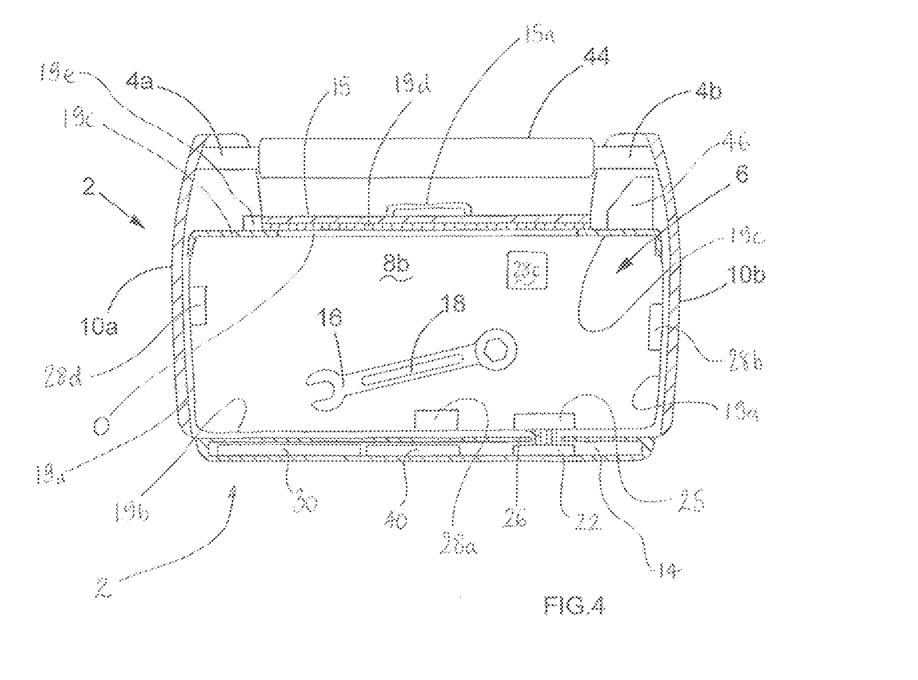
FIG. 4 shows a cross-section view IV-IV of the container of FIG. 1.

The electrical circuit 20 comprises multicoloured light emitting diodes (LEDs) 38 (two multicoloured LEDs are shown but it could be one of more LEDs), a movement detector 40, a display 42, and a speaker 43 all of which are directly coupled to the data processing device 22. The data processing device 22, the battery pack 30 and the movement detector 40 are shown in FIG. 4 as being housed within the cavity 14 of the base 12. Optionally, the data processing device 22, the battery pack 30 and the movement detector 40 may be housed elsewhere in the tool bag 2, for example in a pocket in a side wall 8a, 8b or an end wall 10a, 10b. This is provided that there is suitable physical protection from RFID-tagged tools 16 contained within the tool bay 6.

The middle of the handle 4 is surrounded by an elongate tubular sheath 44 spanning short parts 4a, 4b of the handle 4 connected to opposite ends of the frame of the tool bag 2. The sheath 44 is sized to be grasped by a user's hand. The sheath 44 may have a soft exterior to make it more comfortable for the user.

The initialisation button 32, the on/off button 36, the LEDs 38, the display 42 and the speaker 43 are housed in a box 46 located on top of the shield roof 19c at one end of the tool bag 2 under the short part 4b of the handle 4. Optionally, the box 46 may be located elsewhere in the tool bag 2, for example on a side wall 8a, 8b or an end wall 10a, 10b. This is provided that there is suitable physical protection from RFID-tagged tools 16 contained within the tool bay 6 and that the initialisation button 32, the on/off button 36, the LEDs 38, the display 42 and the speaker 43 are visually, audibly and physically accessible.

The battery pack 30 comprises rechargeable cells which supply the electrical circuit 20 with an electrical power supply of approximately 24 Volts and 2.5 Amperes. The actual voltage and current of the power supply can vary according to manufacturer preferences without changing the character of the invention. Electrical current from the battery pack 30 is connected or disconnected to the antenna reader 25 by the on/off button 36 which is operable by the user.

The sensor 19e detects whether the lid 15 is open, or closed, and transmits either a lid open signal, or a lid closed signal, to the data processing device 22. The detector device 21, 22 is armed when the data processing device 22 receives a lid closed signal. The detector device 21, 22 is disarmed when the data processing device 22 receives a lid open signal.

The initialisation button 32 is operable by the user to initiate counting and identification of any RFID-tagged tools 16 located in the tool bay 6 when the detector 21, 22 device is armed. The multicoloured LEDs 38 are illuminated different colours by the data processing device 22 to convey different optical signals to a user. The speaker 43 is operated by the data processing device 22 to emit audible signals to a user that may complement the colour of multicoloured LEDs 38.

The movement detector 40 comprises an accelerometer which is configured to detect movement of the tool bag 2. When the movement detector 40 detects movement of the tool bag 2 it transmits a movement detection signal to the data processing device 22. This initiate counting and identification of any RFID-tagged tools 16 located in the tool bay 6 when the detector 21, 22 device is armed.

The four internal antennas 28a, 28b, 28c, 28d have a range which, when the lid 15 is closed and the shield 19 is complete, is limited by the shield 19 to detect only RFID-tagged tools 16 located in the tool bay 6. As mentioned above, this ensures that the four internal antennas 28a, 28b, 28c, 28d cannot detect any RFID-tagged tools 16 located outside the shield 19 and therefore the outside the tool bay 6.

Having four internal antennas, one antenna 28a located adjacent the base 12, one antenna 28b, 28d adjacent each of the end walls 10a, 10b and one antenna 28c adjacent a side wall 8*a* (or alternatively the other side wall 8*b*) optimises detection of the RDID-tagged tools 16 located in the tool bay 6. As such, there is at least one antenna 28*a*, 28*b*, 28*c*, 28*d* orientated in each one of three mutually orthogonal X, Y, Z axes of the tool bay 6. There is an antenna 28*b*, 28*d* adjacent each end wall 10*a*, 10*b* because the distance spanning these end walls is the largest dimension of the container 2 and its tool bay 6.

The antenna reader 25 is configured to read information from the internal antennas 28*a*, 28*b*, 28*c*, 28*d* on RFID-tagged tools 16 in the tool bay 6. This information is supplied from the reader device 21 to the data processing device 22 which identifies the RFID-tagged tools 16 and records them in the memory 24. The LCD display 42 communicates information from the data processing device 22 to the user, for example the number of RFID-tagged tools 16 in the tool bay 6 and/or the identity of a missing RFID-tagged tool 16.

Figure 8:
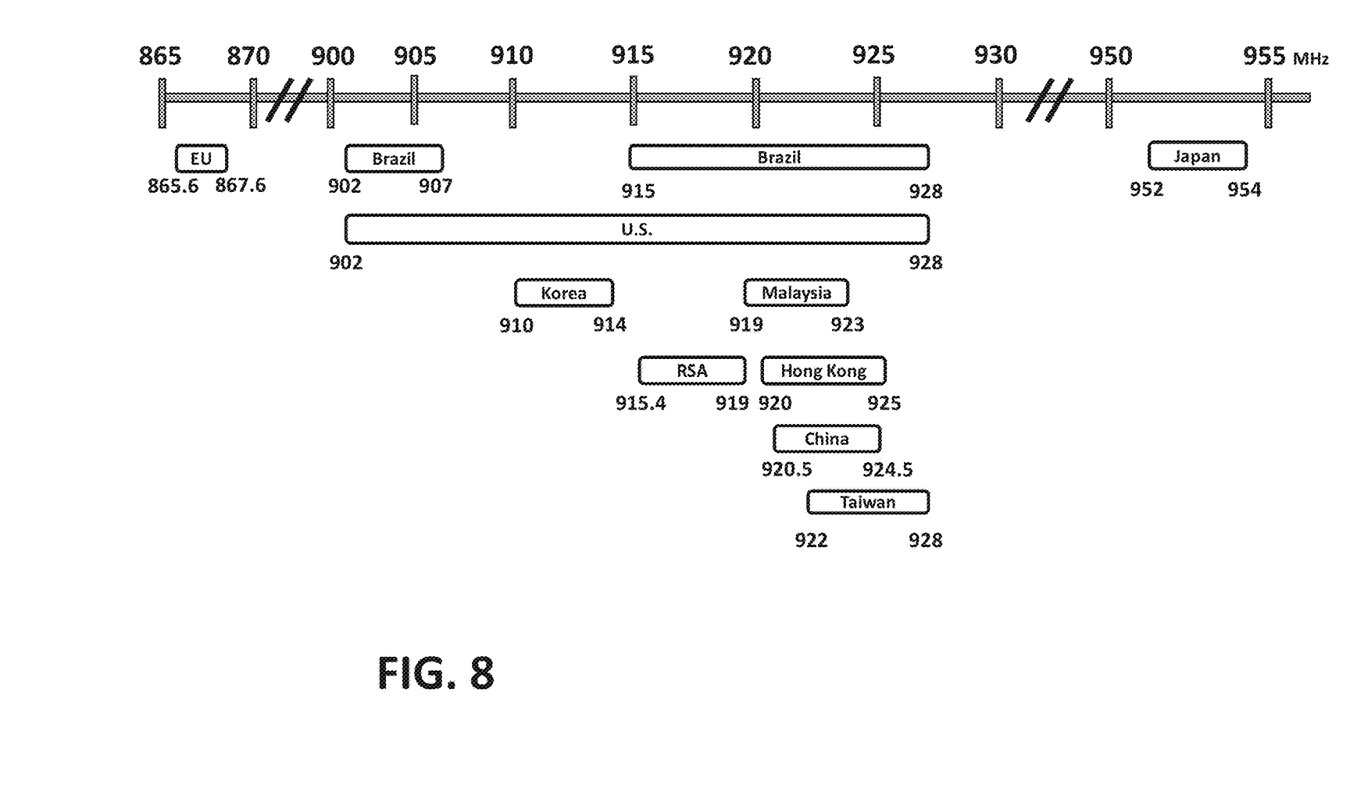
FIG. 8 shows frequency allocations of various countries.

The X axis of the bar chart of FIG. 8 indicates frequencies expressed in MHz (megahertz). The bars indicate each country's allowable band width of radio frequency signals in the open environment for the purpose of detection of RFID devices like the RFID-tagged tools 16 described herein. The tool bay 6 is an environment enclosed within the shield 19 when the lid 15 is closed. Advantageously, the tools bag 2 can be used in any country independently of that country's allowable band width.

Use of the tool bag 2 shall now be described in more detail.

Initially, a user takes the tool bag 2 to a storage facility, for example a storeroom. The user operates the on-off button 36 to supply the electrical circuit 20 with electrical current and waits a few moments. The data processing unit 22 illuminates the LEDs 38 blue for a few seconds to alert the user that when the electrical circuit 20 is ready for use.

The user opens the lid 15. The sensor 19*e* detects this and transmits a lid open signal to the data processing device 22. The user fills the tool bay 6 with any RFID-tagged tools 16 required to perform a particular job. The storage facility may be equipped with a key (not shown) comprising an RFID device programmed with data to authorise, or unlock, an initialisation cycle by the electrical circuit 20. The user places the RFID-tagged key in the tool bay 6 and closes the lid 15. The sensor 19*e* detects this and transmits a lid closed signal to the data processing device 22. Note that without closure of the lid 15 the detector device 21, 22 is not armed and without of the RFID-tagged key an initialisation cycle is locked and cannot be performed.

When the detector device 21, 22 is armed by closure of the lid 15, and the initialisation button 32 has been depressed, the reader device 21, via the internal antennas 28*a*, 28*b*, 28*c*, 28*d*, detects the presence of the RFID-tagged key in the tool bay 6 and an initialisation cycle begins. The memory 24 may already be programmed with a list of all the RFID-tagged tools 16 in the storeroom, but this is not strictly necessary as the detector device 21, 22 may be able to extract all the information it needs from the RFID-tagged tools 16 on their own.

The reader device 21 counts and identifies RFID-tagged tools 16 located in the tool bay 6 and records an initial reference list of RFID-tagged tools 16 in the memory 24 of the data processing device 22. When the initialisation cycle is complete, the electrical circuit 20 illuminates the LEDs 38 green for a few seconds and indicates the number and/or identity of the RFID-tagged tools 16 located in the tool bay 6 on the display 42. The green LEDs 38 reassure the user that the electrical circuit 20 has counted, identified and memorised the reference list of 'known' RFID-tagged tools 16 and that the tool bag 2 is ready to be transported from the storage facility. Optionally, the green LEDs 38 may be supplemented by an audible alarm emitted by the speaker 43.

Normally, the RFID-tagged key is returned to the storage facility for safe keeping although it may be retained by the user in certain circumstances. As would be understood by the skilled addressee, the storage facility may issue something other than a RFID-tagged key to authorise, or unlock, the initialisation cycle of the electrical circuit 20 like, for example, a mechanical key or an access code (if the box 46 had a code entry means).

Next, the user transports the tool bag 2 to a job site, positions the tool bag 2 near or at the job site and opens the lid 15. The sensor 19*e* detects this and transmits a lid open signal to the data processing device 22. The user removes one or more RFID-tagged tools 16 required to do a job from the tool bay 6. With the lid 15 open the detector device 21, 22 is disarmed. RFID-tagged tools 16 can enter and exit the tool bay 6 without provoking a reaction from the electrical circuit 20 because it is dormant. This helps to reduce power consumption and extend the life of the battery pack 30 between recharges.

At the end of a job the user may chose to move the tool bag 2 to another job site or return it to the storage facility. The user returns the RFID-tagged tools 16 to the tool bay 6 and closes the lid 15. The sensor 19*e* detects this and transmits a lid closed signal to the data processing device 22. With the lid 15 closed the detector device 21, 22 is armed. An initialisation cycle is not authorised (i.e. it is locked) in the absence of the RFID-tagged key even if the initialisation button 32 is depressed. The movement detector 40 detects movement of the tool bag 2 and the data processing device 22 automatically initiates a verification cycle of RFID-tagged tools 16 located in the tool bay 6. During the verification cycle, the transponder reader device 21, using the internal antennas 28*a*, 28*b*, 28*c*, 28*d*, detects the presence of RFID-tagged tools 16 in the tool bay 6. The data processing device 22 compares the RFID-tagged tools 16 actually located in the tool bay 6 with the reference list of 'known' RFID-tagged tools 16.

If the verification cycle reveals that the same RFID-tagged tools 16 are in the tool bay 6 as are on the reference list, the electrical circuit 20 illuminates the LEDs 38 green for a few seconds to reassure the user that no RFID-tagged tools 16 are absent. Optionally, the green LEDs 38 may be supplemented by an audible alarm emitted by the speaker 43.

If the verification cycle reveals that one or more 'unknown' RFID-tagged tools 16 are in the tool bay 6 that are not on the reference list, the electrical circuit 20 flashes the LEDs 38 red for a few seconds to warn the user. Optionally, the flashing red LEDs 38 may be supplemented by an audible alarm emitted by the speaker 43 which is distinct from the audible alarm sounded when the LEDs 38 are illuminated green. This prevents the user from accidentally taking a RFID-tagged tool 16 that does not belong to the user.

If the verification cycle reveals that one or more RFID-tagged tools 16 on the reference list are absent from the tool bay 6 the electrical circuit 20 illuminates the LEDs 38 red for a few seconds to warn the user. Optionally, the illuminated red LEDs 38 may be supplemented by an audible alarm emitted from the speaker 43 which is distinct from the audible alarm sounded when the LEDs 38 are illuminated green or when the LEDs 38 flash red. This avoids RFID-tagged tools 16 being left behind at the job and possibly remaining inside machinery where they can cause damage. The display 42 indicates the number and identity of absent RFID-tagged tools 16 so that the user knows what to search for and return them to the tool bay 6.

Once the user considers that all the RFID-tagged tools 16 have been recovered the user closes the lid 15. The sensor 19e detects this and transmits a lid closed signal to the data processing device 22. With the lid 15 closed the detector device 21, 22 is again armed. The user can transport the tool bag 2 to another job site or return it to the storage facility. The movement detector 40 detects movement of the tool bag 2 and the data processing device 22 initiates another verification cycle of RFID-tagged tools 16 located in the tool bay 6. The new verification cycle should confirm that the same RFID-tagged tools 16 are in the tool bay 6 as are on the reference list. If so, the electrical circuit 20 will illuminate the LEDs 38 green for a few seconds to reassure the user that no RFID-tagged tools 16 are absent. If not, and the new verification cycle discovers that one or more RFID-tagged tools 16 on the reference list are still absent from the tool bay 6, the electrical circuit 20 illuminates the LEDs 38 red for a few seconds to warn the user. Optionally, illumination of the LEDs 38 may be supplemented by the audible alarm emitted from the speaker 43. Normally, the user continues to search for any missing RFID-tagged tools 16 until they are finally recovered.

In an optional variant of the detector device 21,22, and without departing from the scope of the invention, the verification cycle may, when the lid 15 is closed, be initiated when the user voluntarily depresses the initialisation button 32 and without necessarily having moved the container 2.

Ultimately, at the end of the working day, the user transports the tool bag 2 to the storage facility, puts it down, opens the lid 15. The sensor 19e detects this and transmits a lid open signal to the data processing device 22. The user empties the RFID-tagged tools 16 from the tool bay 6. With the lid 15 opened the detector device 21, 22 is disarmed. The user places the RFID-tagged key in the tool bay 6, closes the lid 15. The sensor 19e detects this and transmits a lid closed signal to the data processing device 22. Closure of the lid 15 arms the detector device 21,22. The reader device 21, via the internal antennas 28a, 28b, 28c, 28d, detects the presence of the RFID-tagged key so that a fresh initialisation cycle is authorised (i.e. it is unlocked). The initialisation button 32 is depressed by the user and the electrical circuit 20 counts and identifies what should be zero RFID-tagged tools 16 in the tool bay 6. The reference list of RFID-tagged tools 16 recorded in the memory 24 is reset to zero. The electrical circuit 20 illuminates the LEDs 38 red for a few seconds to inform the user. Optionally, the red LEDs 38 may be supplemented by an audible alarm emitted by the speaker 43. The user operates the on-off button 36 to cut the supply of electrical current to the electrical circuit 20 and deactivate it. Thus, the tool bag 6 can be used with any number or combination of RFID-tagged tools 16 because the electrical circuit 20 is capable of re-counting and re-identifying the RFID-tagged tools 16 in the tool bay 6 to refresh the reference list recorded in the memory 24.

The battery pack 30 can be connected to a battery recharger (not shown) via battery socket 52 for recharging its empty cells as and when required. Battery charging is only possible when the electrical current from the battery pack 30 is disconnected by the on/off button 36.

Without departing from the scope of the invention, the electrical circuit 20 can be fitted, or retro-fitted, to any portable container, with or without wheels, for example tool cabinets, tool cupboards, tool boxes, backpacks, and the like, and not just the tool bag 2 described above.

Likewise, the actual colours of the LEDs 38 chosen to indicate signals to the user can be varied according to manufacturer preferences without changing the character of the invention.

The invention claimed is:

1. A portable container (2) for one or more articles (16) each tagged with a respective Radio Frequency Identification (RFID) device (18), wherein the container (2) comprises:
   a bay (6) having at least one opening (0) for removal and/or placement of RFID-tagged articles (16) in the bay (6);
   a lid (15) for covering the at least one opening in the bay (6), wherein the lid is openable to permit access to the bay (6);
   a detector device (21,22) for detecting RFID-tagged articles (16) located in the bay (6);
   a power supply (30) for supplying electrical power to the detector device (21,22); and
   wherein the container (2) further comprises:
   an electromagnetic shield (19) wherein the bay (6) and the at least one opening in the bay (6) is enclosed by the electromagnetic shield (19) and wherein the lid (15) forms part of the electromagnetic shield (19); and
   an electromagnetic interference filter coupled to each connection (26) across the electromagnetic shield (19).

2. A portable container (2) as claimed in claim 1, wherein the lid (15) is electrically connectable to the electromagnetic shield (19) around the at least one opening in the bay (6).

3. A portable container (2) as claimed in claim 2, wherein the portable container (2) comprises a sensor (19e) for sensing electrical connection of the lid (15) around the at least one opening in the bay (6), wherein the at least one sensor is configured to transmit a lid closed signal to the detector device (21,22) when the lid is electrically connected around the at least one opening in the bay (6).

4. A portable container (2) as claimed in claim 3, wherein the container (2) comprises:
   an activation means (32) in communication with the detector device (21,22), wherein the activation means (32) is operable to cause the detector device (21,22) to detect a reference list of RFID-tagged articles (16) located in the bay (6);
   a verification means (40) in communication with the detector device (21,22), wherein the verification means (40) is operable by movement of the container (2) to cause the detector device (21,22) to detect RFID-tagged articles (16) located in the bay (6) and to signal deviation from the reference list; and
   a signal means (38,42,43) in communication with the detector device (21,22) for transmitting signals from the detector device (21,22) to a user.

5. A portable container (2) as claimed in claim 1, wherein the lid is magnetically connectable to the shield (19).

6. A portable container (2) as claimed in claim 5, wherein the electromagnetic shield (19) comprises flexible electromagnetically shielded material.

7. A portable container (2) as claimed in claim 1, wherein the lid is hingedly coupled to the portable container (2).

8. A portable container (2) as claimed in claim 1, wherein the container (2) comprises:
   an activation means (32) in communication with the detector device (21,22), wherein the activation means (32) is operable to cause the detector device (21,22) to detect a reference list of RFID-tagged articles (16) located in the bay (6);

a verification means (40) in communication with the detector device (21,22), wherein the verification means (40) is operable by movement of the container (2) to cause the detector device (21,22) to detect RFID-tagged articles (16) located in the bay (6) and to signal deviation from the reference list; and a signal means (38,42,43) in communication with the detector device (21,22) for transmitting signals from the detector device (21,22) to a user.

9. A portable container (2) as claimed in claim 8, wherein the detector device (21,22) is configured to signal an article absent signal upon detection of absence of a RFID-tagged article (16) on the reference list and the detector device (21,22) is configured to signal a unknown article signal upon detection of a RFID-tagged article (16) not on the reference list.

10. A portable container (2) as claimed in claim 9, wherein the detector device (21,22) is lockable against detection of the reference list, optionally wherein the detector device (21,22) is configured to signal an initialisation signal upon interaction with a key configured to permit detection of the reference list.

11. A portable container (2) as claimed in claim 8, wherein the detector device (21,22) is lockable against detection of the reference list, optionally wherein the detector device (21,22) is configured to signal an initialisation signal upon interaction with a key configured to permit detection of the reference list.

12. A portable container (2) as claimed in claim 8, wherein the verification means (40) comprises an accelerometer.

13. A portable container (2) as claimed in claim 8, wherein the signal means comprises at least one LED (38), wherein each LED (38) is a multicoloured LED.

14. A portable container (2) as claimed in claim 8, wherein the signal means comprises a display (42) configured to display the number or identify of RFID-tagged articles (16) detected by the detector device (21,22) in the container (20).

15. A portable container (2) as claimed in claim 14, wherein the display (42) is configured to display the article absent signal and wherein the article absent signal comprises the number or identify of absent RFID-tagged articles (16).

16. A portable container (2) as claimed in claim 1, wherein the detector device (21,22) comprises a reader device (21) comprising an antenna reader (25) and at least four antennas (28a,28b,28c,28d) in communication with the antenna reader (25), and wherein the antenna (28a,28b,28c,28d) is configured to detect RFID-tagged articles (16) in the bay (6).

17. A portable container (2) as claimed in claim 1, wherein the detector device (21,22) comprises a data processing device (22) having a central processing unit (23) and a memory (24) for recording at least the reference list.

18. A portable container as claimed in claim 1, wherein the container comprises one of a tool cabinet, a tool cupboard, a tool box, and a tool bag (2).

19. A portable container as claimed in claim 1, wherein the container the container includes one or more support wheels.

* * * * *